United States Patent
Jachmann

(10) Patent No.: US 10,333,517 B2
(45) Date of Patent: Jun. 25, 2019

(54) OPTOELECTRONIC SENSOR

(71) Applicant: SICK AG, Waldkirch/Breisgau (DE)

(72) Inventor: Fabian Jachmann, Freiburg (DE)

(73) Assignee: SICK AG, Waldkirch (DE)

( * ) Notice: Subject to any disclaimer, the term of this patent is extended or adjusted under 35 U.S.C. 154(b) by 228 days.

(21) Appl. No.: 15/398,413

(22) Filed: Jan. 4, 2017

(65) Prior Publication Data

US 2017/0201252 A1    Jul. 13, 2017

(30) Foreign Application Priority Data

Jan. 11, 2016    (DE) .................. 10 2016 100 322

(51) Int. Cl.
| | |
|---|---|
| *H03K 17/94* | (2006.01) |
| *G01S 7/48* | (2006.01) |
| *G01S 17/42* | (2006.01) |
| *G01S 7/497* | (2006.01) |

(52) U.S. Cl.
CPC .............. *H03K 17/941* (2013.01); *G01S 7/48* (2013.01); *G01S 7/497* (2013.01); *G01S 17/42* (2013.01); *G01S 2007/4975* (2013.01)

(58) Field of Classification Search
CPC ....... H03K 17/941; G01S 7/497; G01S 17/42; G01S 7/48; G01S 2007/4975
USPC .................................................. 250/559.41
See application file for complete search history.

(56) References Cited

U.S. PATENT DOCUMENTS

| | | | | |
|---|---|---|---|---|
| 6,153,878 A | * | 11/2000 | Jakob ................... | G01S 7/4811 |
| | | | | 250/216 |
| 8,805,302 B2 | * | 8/2014 | Pantfoerder .......... | G01J 1/0407 |
| | | | | 455/575.8 |
| 2005/0030529 A1 | | 2/2005 | Schuler et al. | |
| 2008/0158555 A1 | | 7/2008 | Mori | |

(Continued)

FOREIGN PATENT DOCUMENTS

| | | |
|---|---|---|
| DE | 3408261 A1 | 9/1998 |
| DE | 19732776 C1 | 2/1999 |
| DE | 10117397 A1 | 10/2002 |

(Continued)

OTHER PUBLICATIONS

Partial European Search Report dated Jun. 8, 2017 in corresponding European Patent Application No. 16204877.1.

*Primary Examiner* — Seung C Sohn
(74) *Attorney, Agent, or Firm* — Nath, Goldberg & Meyer; Jerald L. Meyer

(57) ABSTRACT

The invention relates to an optoelectronic sensor for monitoring a monitored zone. The sensor comprises a main light transmitter for transmitting sensing light signals that propagate through a protective screen into the monitored zone; a main light receiver for receiving light that emanates from the monitored zone; and a control unit for controlling the sensor. The sensor is configured in this respect to carry out a contamination recognition in which the degree of contamination of the protective screen is determined by means of a measured contamination value. The sensor in accordance with the invention is characterized in that the control unit is adapted to recognize the approach of a hand and/or of a finger toward the protective screen with reference to the contamination recognition and to output an action signal on the recognition of the hand and/or of the finger.

21 Claims, 1 Drawing Sheet

(56) References Cited

U.S. PATENT DOCUMENTS

2010/0245849 A1  9/2010  Satzky et al.

FOREIGN PATENT DOCUMENTS

| DE | 10151979 A1 | 4/2003 |
| DE | 10340702 A1 | 3/2005 |
| DE | 102005032402 B3 | 9/2006 |
| EP | 2237065 A1 | 10/2010 |
| EP | 2811318 A1 | 5/2014 |

* cited by examiner

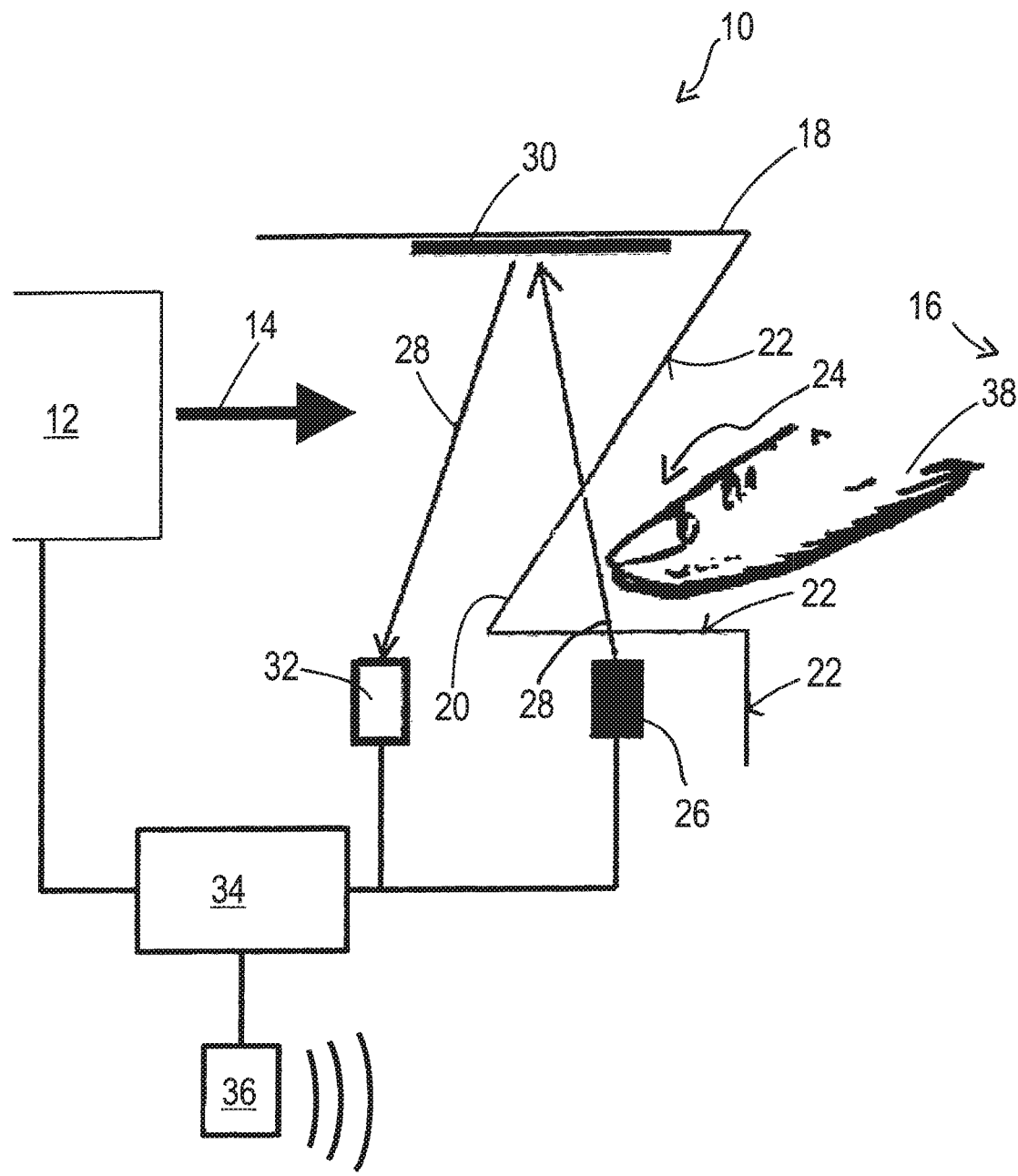

OPTOELECTRONIC SENSOR

The present invention relates to an optoelectronic sensor for monitoring a monitored zone, having a main light transmitter for transmitting sensing light signals that propagate through a protective screen into the monitored zone; having a main light receiver for receiving light that emanates from the monitored zone; and having a control unit for controlling the sensor. The sensor is configured in this respect to carry out a contamination recognition in which the degree of contamination of the protective screen is determined by means of a measured contamination value.

Optoelectronic sensors, in particular in the form of laser scanners, are frequently used for monitoring, in particular for monitoring work zones or machines. Such optoelectronic sensors or scanners can likewise be used for the security of automated guided vehicles (so-called AGVs), with the optoelectronic sensor being able to be mounted on the automated guided vehicle. The optoelectronic sensor serves to recognize articles, persons and the like in the monitored zone and to output a warning signal where necessary, whereupon the guided vehicle e.g. stops to prevent a collision with a person.

The optoelectronic sensor can for this purpose transmit sensing light signals into the monitored zone during the monitoring, said signals being remitted or reflected by an object that may be present there. At least some of the remitted or reflected light again arrives at the optoelectronic sensor and is there detected by the main light receiver.

Such optoelectronic sensors cannot only be used for monitoring a monitored zone or a protected zone and/or a danger area, but also serve for preparing distance profiles and for 3D sensing. The used term "monitoring" should be understood in this general sense even though examples of the safety application are described in the majority of cases here.

Known optoelectronic sensors comprise a control unit that controls and monitors the functions of the sensor. To change the function of the sensor, switches or a keyboard are typically provided with which, for example, specific functions of the sensor can be activated or deactivated.

The switches or the keyboard disadvantageously require/requires a specific construction space, whereby the sensors are increased in size. In addition, as further components, they cause additional manufacturing costs and maintenance costs.

It is therefore the underlying object of the invention to provide an optoelectronic sensor that can be operated manually in a simple manner, that has a compact construction shape and that can be manufactured at low cost.

This object is satisfied by an optoelectronic sensor in accordance with claim 1, and in particular in that the control unit is adapted to recognize the approach of a hand and/or of a finger toward the protective screen with reference to the contamination recognition and to output an action signal on the recognition of the hand and/or of the finger. The approach of the hand or of the finger toward the protective screen can therefore replace the pressing of a button or the actuation of a switch.

The invention makes use of the recognition in this respect that a contamination recognition anyway provided in the sensor can also be used for recognizing a hand or a finger to hereby carry out inputs at the sensor that typically take place by means of the switches or of the keyboard. In this manner, the switches and/or the keyboard can be omitted, whereby the sensor is simultaneously more compact and can be manufactured at lower cost.

Actions can be carried out, triggered by the action signal that, for example, effect a change of the sensing rate or of the range of the sensor.

For example, a hand or a finger can be placed onto the protective screen for carrying out the action, whereby the hand or the finger is recognized as particularly strong "dirt", with such a strong contamination (and thus a particularly high measured contamination value) typically not occurring. A distinction can to this extent be made between "normal" dirt and the hand or the finger. The action signal is then output in response to the placed on hand or finger.

In general, the main light transmitter can be a laser that irradiates the sensing light signals into the monitored zone, for example via a rotating sensor head. The sensor can therefore be a laser scanner. The protective screen can be configured as revolving around the sensor head and can allow the sensor head a 360° view, whereby the monitored zone can be located at all sides of the optoelectronic sensor.

Instead of a hand or of a finger, a different body part or a different non-transparent article can also be used to trigger the action signal.

Advantageous further developments of the invention can be seen from the description, from the drawing and from the dependent claims.

In accordance with a first advantageous embodiment of the invention, the sensor is configured to emit a monitoring light signal through the protective screen for the carrying out of the contamination recognition, with the sensor preferably being configured to measure a transmission through the protective screen and/or a reflection at the protective screen. The transmission through the protective screen that decreases as the contamination of the protective screen increases, can therefore e.g. be measured by means of the monitoring light signal. When a hand or a finger is placed on or approaches the protective screen, the transmission can drop by a particularly high amount and can in particular be completely suppressed.

When measuring a reflection at the protective screen, the reflection can be used to recognize dirt, a hand or a finger (i.e. the presence of a hand or of a finger is recognized) since both dirt and a finger or a hand can at least partly reflect the monitoring light signal. On an occurring very strong reflection at the protective screen, it can accordingly be assumed that a hand or a finger e.g. contacts the protective screen.

The main light transmitter is preferably adapted to transmit the monitoring light signal and/or the main light receiver is configured for receiving the monitoring light signal. The monitoring light signal can therefore be identical to the sensing light signal, with a reflection at the protective screen also being measurable via the sensing light signal. Only that signal portion from the received light that is a reflection of the sensing light signal can, for example, be used for this purpose that is identified as emanating from the protective screen due to its transit time. The contamination recognition can consequently comprise a transit time measurement to recognize sensing light signals reflected from the protective screen, by dirt, by a hand or by a finger.

Alternatively or additionally, the sensor comprises at least one additional light sensor that is adapted to transmit the monitoring light signal and/or the sensor comprises at least one additional light receiver that is configured for receiving the monitoring light signal. This means that the contamination recognition can be carried out by a system separate from the main light transmitter and/or from the main light receiver, namely by the additional light transmitter and/or by the additional light receiver. The additional light transmitter is preferably arranged separately from the main light transmitter. A plurality of additional light transmitters and/or a plurality of additional light receivers can, for example, also be provided that preferably respectively carry out a contamination recognition at different points of the protective screen.

In accordance with a preferred embodiment, the protective screen comprises an engagement region that is accessible for a hand and/or for a finger from outside the sensor, with the protective screen and the engagement region being shaped such that the monitoring light signal passes through the protective screen at a first point, runs through the engagement region, and subsequently passes through the protective screen at a second point.

The protective screen can be concave in the engagement region so that, with a straight-line propagation of the monitoring light signal, the monitoring light signal can run through the engagement region. If now a hand or a finger is held in the engagement region or is placed onto the protective screen in the engagement region, the monitoring light signal can be prevented from running through the engagement region, whereby the monitoring light signal can no longer pass through the protective screen at the second point. Such an absorption of the monitoring light signal can e.g. be detected by the additional light receiver, with the control unit thereupon being able to output an action signal.

If only "normal" contamination is present, the monitoring light signal can be attenuated by dirt located on the protective screen when passing through the protective screen, but can run through the engagement region and arrive at the additional light receiver at attenuated strength. The additional light receiver can be arranged such that it receives the monitoring light signal after passing through the protective screen at the second point.

In accordance with a further advantageous embodiment, the protective screen comprises a peripheral side wall, with the engagement region defining a peripheral recess of the side wall. The protective screen can, for example, be of cup shape, hat shape or cylinder shape. In this respect, the protective screen can have a regionally Z-shaped design in cross-section due to the peripheral recess.

A plurality of additional light transmitters and a plurality of additional light receivers are preferably arranged in the region of the peripheral side wall. The additional light transmitters can, for example, be evenly distributed in the peripheral direction of the side wall with a cup-shaped, hat-shaped or cylindrical protective screen. In this manner, a contamination recognition can be carried out at the total side wall. Exactly one additional light receiver can, for example, be associated with each additional light transmitter.

In accordance with a preferred embodiment, the control unit is adapted to consider a hand or a finger as recognized when the measured contamination value exceeds a predefined threshold value. Since a hand or a finger is impenetrable for the monitoring light signal of the contamination recognition, the measured contamination value, that indicates the degree of contamination, can be very high with a hand or a finger even though no contamination is actually present. Such a high measured contamination value can preferably not be reached by "normal" contamination. The use of the threshold value thus allows a reliable distinction to be made between a hand or a finger and contamination that typically occurs in reality.

In accordance with a further advantageous embodiment, the sensor is configured only to determine the approach of a hand and/or of a finger in a predefined recognition region of the protective screen, with the recognition region preferably taking up less than 50%, particularly preferably less than 10%, of the surface of the protective screen. This means that the action signal can only be triggered in the recognition region by a hand or by a finger, i.e. when, for example, a finger touches the protective screen in the recognition region. A protection against incorrectly triggered action signals can be provided in this manner since e.g. an occurring extraordinarily strong contamination outside the recognition region does not result in an action signal. The recognition region can in this respect have any desired shape on the surface of the protected screen or can be any desired predefined region of the protective screen.

The recognition region is preferably divided into a plurality of predefined, mutually separate part regions. The part regions in particular allow an improvement of the correction recognition as to whether the output of an action signal is actually desired. This can take place, for example, by the use of a plurality of part regions, with an action only being output on the recognition of a hand or of a finger in each part region. It can hereby be necessary, for example, to cover all the part regions with spread fingers to trigger an action of the sensor.

The control unit is particularly preferably adapted to output different action signals in dependence on the part region or on the part regions in which a hand and/or a finger is/are recognized. A hand or a finger recognized in a part region can for this purpose count as a logical "1" for the part region, whereas a logical "0" is used for a part region without a recognized hand or without a recognized finger. The logical state values of the part regions thus predefined can be logically linked to trigger different actions. For example, on the presence of a "1" in all part regions, a first action signal can be output, whereas on the presence of a logical "1" in exactly only one part region a second action signal can be output that triggers an action that is different from an action that is initiated by the first action signal.

In accordance with a further advantageous embodiment, the control unit is adapted to output different action signals in dependence on a time component of the recognition of a hand and/or of a finger in the recognition region or in at least one of the part regions. This means that an action signal is, for example, only output when the presence of a hand is recognized again several times after one another within a predefined time period, with time periods in which no hand is recognized having to lie between the respective recognition. For example, different action signals can be output when the hand is recognized three times within the time period or ten times within the time period. It is e.g. also possible to swipe over the surface of the protective screen with a finger to position the fingers in different part regions after one another in time. This can likewise be recognized to again output different action signals, e.g. in dependence on the direction of the swiping movement. It is generally possible to form a type of keyboard on the surface of the protective screen using the part regions.

It is also possible that only a predefined increase in the measured contamination value within a likewise predefined time interval results in an action signal. Only an increase of the measured contamination value that increases in less than one second from below a lower predefined threshold value to above the already mentioned (upper) threshold value can thus, for example, result in an action signal. It is precluded in this manner that gradually collecting dirt results in an action signal.

In accordance with a further advantageous embodiment, the recognition region and/or the part regions is/are marked, preferably using markings on the protective screen. The markings can facilitate the positioning of the hand or of the finger and can additionally indicate which actions are the consequence of a touching of the protective screen in which regions. The markings can, for example, be fixedly attached lettering, arrows, borders and the like. The markings can, however, also e.g. be projected onto the protective screen using visible light.

The sensor is preferably configured to carry out a reset in response to the action signal and/or to activate or deactivate a radio interface. The radio interface can, for example, be a WLAN interface or a Bluetooth interface that is usually switched off to keep EMC pollution by the sensor low. The radio interface can, for example, be activated for a predefined time by a touching of the protective screen in the recognition region to allow a further-going configuration of the sensor.

The actions carried out in response to the action signal can generally be restricted to non-safety relevant functions.

A further subject of the invention is a method of operating an optoelectronic sensor that serves for the monitoring of a monitored zone, with the sensor transmitting sensing light signals through a protective screen into the monitored zone by means of a main light transmitter, receiving light emanating from the monitored zone by means of a main light receiver, and with a contamination recognition being carried out in which a degree of the contamination of the protective screen being determined by means of a measured contamination value. The method in accordance with the invention is characterized in that the approach of a hand and/or of a finger toward the protective screen is recognized with reference to the contamination recognition and in that an action signal is output when a hand and/or a finger is recognized.

The statements made with respect to the optoelectronic sensor in accordance with the invention, in particular with respect to advantages and preferred embodiments, apply accordingly to the method in accordance with the invention.

The invention will be described in the following purely by way of example with reference to the drawing. There is shown:

FIG. 1 a schematic view of an optoelectronic sensor.

FIG. 1 shows a schematic view of an optoelectronic sensor that is configured as a laser scanner 10. The laser scanner 10 comprises a rotating sensor head 12 in which a laser diode is arranged as a main light transmitter and a photodiode cell is arranged as a main light receiver (both not shown). Sensing signals 14 are irradiated from the sensor head 12 into a monitored zone 16.

The sensing signals 14 pass through a fixed-position protective screen 18 that is produced from a transparent material on their path into the monitored zone 16. The protective screen 18 is configured as running around the sensor head 12 with respect to the axis of rotation (not shown) of the sensor head 12 and comprises a recess 20 in a peripheral side wall 22 that defines an engagement region 24.

The sensing light signals 14 pass through the protective screen 18 in the region of the peripheral side wall 22.

The protective screen 18 has a Z-shaped design in cross-section in the region of the side wall 22 due to the recess 20.

The laser scanner 10 comprises an additional light transmitter 26 that transmits a monitoring light signal 28 such that it runs through the engagement region 24, with only a schematic optical path of the monitoring light signal 28 being shown in FIG. 1. The additional light transmitter 26 is arranged within the protective screen 18 so that the monitoring light signal 28 passes through the peripheral side wall 22 of the protective screen 18 before and after running through the engagement region 24.

After the second passing through of the side wall 22, the monitoring light signal 28 is incident onto a reflector 30 that supplies the monitoring light signal 28 to an additional light receiver 32.

The additional light transmitter 26, the additional light receiver 32 and also the sensor head 12 are coupled to a control unit 34. The control unit 34 is additionally connected to a WLAN interface 36.

In the operation of the laser scanner 10, the sensor head 12 periodically transmits sensing light signals 14 into the monitored region 16 in order, for example, to detect articles and persons in the monitored zone 16.

At the same time, a monitoring light signal 28 is transmitted by the additional light transmitter 26 that is attenuated on passing through the protective screen 18 in dependence on the dirt present on the protective screen 18. Such an attenuation of the monitoring light signal 28 can be detected by the additional light receiver 32.

If a finger 38 is now introduced into the engagement region 24, the monitoring light signal 28 is almost completely interrupted so that almost no light of the monitoring light signal 28 arrives at the additional light receiver 32. The control unit 34 recognizes this as very strong contamination or as a very high measured contamination value. In this respect, a threshold value of the measured contamination value is exceeded, with the control unit 34 assuming the presence of the finger 38 in the engagement region 24 on the exceeding of the threshold value. The control unit 34 thereupon outputs an action signal that produces the temporary activation of the WLAN interface 36.

The laser scanner 10 can therefore be switched in a simple manner solely by the introduction of the finger 38 into the engagement region 24 into a mode in which the laser scanner 10 can be reached by radio via the WLAN interface 36.

REFERENCE NUMERAL LIST 10 laser scanner
12 sensor head
14 sensing light signal
16 monitored zone
18 protective screen
20 recess
22 peripheral side wall
24 engagement region
26 additional light transmitter
28 monitoring light signal
30 reflector
32 additional light receiver
34 control unit
36 WLAN interface
38 finger

What is claimed is:

1. An optoelectronic sensor for monitoring a monitored zone, having a main light transmitter for transmitting sensing light signals that propagate through a protective screen into the monitored zone;
  having a main light receiver for receiving light that emanates from the monitored zone; and
  having a control unit for controlling the sensor,
    wherein the sensor is configured to carry out a contamination recognition in which the degree of contamination of the protective screen is determined by means of a measured contamination value, and wherein the control unit is adapted to recognize an approach of at least one of a hand and a finger toward the protective screen with reference to the contamination recognition and to output an action signal on the recognition of at least one of the hand and the finger.

2. The optoelectronic sensor in accordance with claim 1, wherein the sensor is configured to emit a monitoring light signal through the protective screen for carrying out the contamination recognition.

3. The optoelectronics sensor in accordance with claim 2, wherein the sensor is configured to measure at least one of a transmission through the protective screen and a reflection at the protective screen.

4. The optoelectronic sensor in accordance with claim 2, wherein the main light transmitter is adapted to transmit the monitoring light signal.

5. The optoelectronic sensor in accordance with claim 2, wherein the main light receiver is configured to receive the monitoring light signal.

6. The optoelectronic sensor in accordance with claim 2, further comprising at least one additional light transmitter that is adapted to transmit the monitoring light signal.

7. The optoelectronic sensor in accordance with claim 2, further comprising at least one additional light receiver that is configured for receiving the monitoring light signal.

8. The optoelectronic sensor in accordance with claim 2, wherein the protective screen comprises an engagement region that is accessible for at least one of a hand and a finger from outside the sensor, with the protective screen and the engagement region being shaped such that the monitoring light signal passes through the protective screen at a first point, propagates through the engagement region, and subsequently passes through the protective screen at a second point.

9. The optoelectronic sensor in accordance with claim 8, wherein the protective screen comprises a peripheral side wall, with the engagement region defining a peripheral recess of the side wall.

10. The optoelectronic sensor in accordance with claim 2, further comprising a plurality of additional light transmitters that are adapted to transmit the monitoring light signal and a plurality of additional light receivers that are configured for receiving the monitoring light signal, wherein the protective screen comprises a peripheral side wall, with the engagement region defining a peripheral recess of the side wall, with the plurality of additional light transmitters and the plurality of additional light receivers being arranged in the region of the peripheral side wall.

11. The optoelectronic sensor in accordance with claim 1, wherein the control unit is adapted to consider one of a hand and a finger as recognized when the measured contamination value exceeds a predefined threshold value.

12. The optoelectronic sensor in accordance with claim 1, wherein the sensor is configured only to determine the approach of at least one of a hand and a finger in a predefined recognition region of the protective screen.

13. The optoelectronic sensor in accordance with claim 12, wherein the recognition region takes up less than 50% of the surface of the protective screen.

14. The optoelectronic sensor in accordance with claim 12, wherein the recognition region takes up less than 10% of the surface of the protective screen.

15. The optoelectronic sensor in accordance with claim 12, wherein the recognition region is divided into a plurality of predefined, mutually separate part regions.

16. The optoelectronic sensor in accordance with claim 15, wherein the control unit is adapted to output different action signals in dependence on the part region or on the part regions in which at least one of a hand and a finger is recognized.

17. The optoelectronic sensor in accordance with claim 15, wherein the control unit is adapted to output different action signals in dependence on a time component of the recognition of at least one of a hand and a finger in the recognition region or in at least one of the part regions.

18. The optoelectronic sensor in accordance with claim 15, wherein the recognition region and/or the part regions is/are marked on the protective screen.

19. The optoelectronic sensor in accordance with claim 15, wherein the recognition region and/or the part regions is/are marked with markings on the protective screen.

20. The optoelectronic sensor in accordance with claim 1, wherein the sensor is configured to carry out a reset in response to the action signal and/or to activate or deactivate a radio interface.

21. A method of operating an optoelectronic sensor that serves for the monitoring of a monitored zone, wherein
the sensor transmits sensing light signals through a protective screen into the monitored zone by means of a main light transmitter; wherein
the main light receiver receives light emanating from the monitored zone; wherein
a contamination recognition is carried out in which the degree of contamination of the protective screen is determined by means of a measured contamination value, and wherein
an approach of at least one of a hand and a finger toward the protective screen is recognized with reference to the contamination recognition and an action signal is output on the recognition of at least one of the hand and the finger.

* * * * *